US012765189B2

(12) United States Patent
Hwang et al.

(10) Patent No.: US 12,765,189 B2
(45) Date of Patent: Oct. 13, 2026

(54) DISPLAY DEVICE WITH SHIELD AND LOW REFLECTIVE LAYER STRUCTURES

(71) Applicant: LG Display Co., Ltd., Seoul (KR)

(72) Inventors: Insu Hwang, Seoul (KR); Dongik Kim, Paju-si (KR); Soyoung Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 451 days.

(21) Appl. No.: 18/480,912

(22) Filed: Oct. 4, 2023

(65) Prior Publication Data

US 2024/0224628 A1 Jul. 4, 2024

(30) Foreign Application Priority Data

Dec. 30, 2022 (KR) ........................ 10-2022-0191311

(51) Int. Cl.
*H10K 59/126* (2023.01)

(52) U.S. Cl.
CPC .................................. *H10K 59/126* (2023.02)

(58) Field of Classification Search
CPC .................................................... H10K 59/126
USPC .................... 257/40, 59, 72, 88, 91, 99, 100
See application file for complete search history.

(56) References Cited

U.S. PATENT DOCUMENTS

2007/0035225 A1* 2/2007 Lee .................... H10K 59/8791 313/111
2013/0249383 A1* 9/2013 Yoo .................... H10K 59/8791 445/24
2014/0054554 A1* 2/2014 Lee ...................... H10H 20/813 257/40
2015/0379923 A1* 12/2015 Lee .................... H10K 59/1315 345/82
2016/0049426 A1* 2/2016 Lim ..................... H10K 59/131 438/23
2016/0049454 A1* 2/2016 Park ..................... H10K 59/126 257/40
2020/0052055 A1* 2/2020 Song .................... H10K 59/122
2022/0392987 A1* 12/2022 Liu .................... H10K 59/1213
2024/0078978 A1* 3/2024 Yuan ...................... H10D 86/00

FOREIGN PATENT DOCUMENTS

KR 10-2016-0021353 A 2/2016
KR 10-2016-0078599 A 7/2016

* cited by examiner

*Primary Examiner* — Eric W Jones
(74) *Attorney, Agent, or Firm* — Birch, Stewart, Kolasch & Birch, LLP

(57) ABSTRACT

A display device in one example includes an emitting area located in an active area, a non-emitting area located in the active area, a metal layer located in the non-emitting area, an active layer located in the non-emitting area, a light shield located in the non-emitting area, and a low reflective layer located in the non-emitting area so that at least a portion of the low reflective layer overlaps the light shield. Thus, the display device has a low reflectivity, and it is possible to prevent degradations in the display quality due to parasitic capacitance.

18 Claims, 11 Drawing Sheets

DISPLAY DEVICE WITH SHIELD AND LOW REFLECTIVE LAYER STRUCTURES

CROSS REFERENCE TO RELATED APPLICATION

This application claims priority to Korean Patent Application No. 10-2022-0191311, filed in the Republic of Korea on Dec. 30, 2022, the entire disclosure of which is hereby expressly incorporated by reference into the present application.

BACKGROUND

Field

Embodiments of the present disclosure relate to a display device.

Discussion of Related Art

A display device for displaying various types of information on a screen is a kind of core technology in the era of information and communication technology and serves to display various types of information in an active area.

Such a display device can display information using a display panel emitting light. However, in such a display device using the display panel emitting light, light incident on the display panel is reflected and can reach a user in a situation in which there is an abundance of external light, so it can be difficult for the user to clearly view the information displayed on the display panel.

To address the above limitation, research is being conducted to reduce the reflectivity of a display panel with respect to external light. However, there is still a need for improvement on how to implement a display device having a low reflectivity while maintaining the display quality and efficiency thereof.

SUMMARY OF THE DISCLOSURE

To reduce the reflectivity of a display device, a material layer having low reflective properties can be provided on the display device. However, when a low-reflectivity material layer is formed over a large area to realize a sufficiently low reflectivity, parasitic capacitance is generated between the low-reflectivity material layer and other circuit elements of the display device, thereby the display quality is degraded. When the low-reflectivity material layer is formed in a narrower area, the problem of parasitic capacitance described above can be alleviated to some extent, but it is still difficult to realize a sufficiently low reflectivity. Accordingly, the inventors of the present disclosure have invented a display device that can realize sufficiently low reflectivity, while solving the problem that parasitic capacitance is generated and the display quality is degraded.

Embodiments of the present disclosure provide a display device having a low reflectivity and preventing parasitic capacitance from degrading the display quality by including a low reflective layer located in a non-emitting area, with at least a portion of the low reflective layer overlapping a light shield (or light shielding layer).

According to embodiments of the present disclosure, a display device can include an emitting area located in an active area; a non-emitting area located in the active area; a metal layer located in the non-emitting area; an active layer located in the non-emitting area; a light shield located in the non-emitting area, and a low reflective layer located in the non-emitting area.

The light shield can be located such that at least a portion thereof overlaps the active layer.

The low reflective layer can be located such that at least a portion thereof overlaps the light shield.

According to embodiments of the present disclosure, a display device can include a substrate, a low reflective layer disposed on the substrate, a first insulating layer disposed on the low reflective layer, a light shield disposed on the first insulating layer, a second insulating layer disposed on the light shield, and a transistor disposed on the second insulating layer.

The light shield can be located such that at least a portion thereof overlaps the low reflective layer.

The transistor can be located such that at least a portion thereof overlaps the light shield.

Source-drain electrodes of the transistor, the light shield, and the low reflective layer can be electrically connected in a single contact hole (in other words, in one contact hole).

According to embodiments of the present disclosure, in the display device, a low-reflective layer located in the non-emitting area such that at least a portion thereof overlaps the light shield is provided. Thus, the display device can have a low reflectivity and prevent degradations in the display quality due to parasitic capacitance.

According to embodiments of the present disclosure, in the display device, the low reflective layer is patterned to have a plurality of islands and is electrically connected to the metal layer through the contact hole. Thus, the display device can have a low reflectivity and prevent degradations in the display quality due to parasitic capacitance.

BRIEF DESCRIPTION OF THE DRAWINGS

The above and other objectives, features, and advantages of the present disclosure will be more clearly understood from the following detailed description, taken in conjunction with the accompanying drawings, in which.

DETAILED DESCRIPTION OF THE EMBODIMENTS

Figure 1:
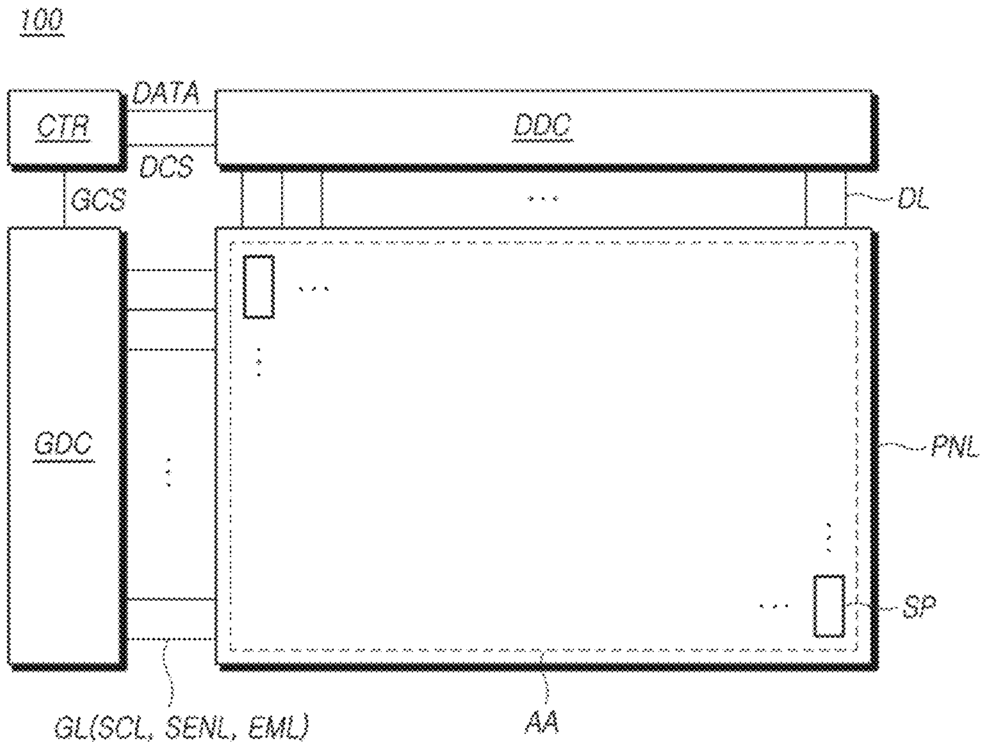
FIG. 1 is a diagram illustrating a system configuration of a display device according to embodiments of the present disclosure.

In the following description of examples or embodiments of the present disclosure, reference will be made to the accompanying drawings in which it is shown by way of illustration of specific examples or embodiments that can be implemented, and in which the same reference numerals and signs can be used to designate the same or like components even when they are shown in accompanying drawings different from one another. Further, in the following description of examples or embodiments of the present disclosure, detailed descriptions of well-known functions and components incorporated herein will be omitted when it is determined that the description can make the subject matter in some embodiments of the present disclosure rather unclear. The terms such as “including”, “having”, “comprising”, “containing”, “constituting”, “made up of”, and “formed of” used herein are generally intended to allow other components to be added unless the terms are used with the term “only”. As used herein, singular forms are intended to include plural forms unless the context clearly indicates otherwise.

Terms, such as “first”, “second”, “A”, “B”, “(A)”, or “(B)” can be used herein to describe elements of the present disclosure. Each of these terms is not used to define essence, order, sequence, or number of elements etc., but is used merely to distinguish the corresponding element from other elements.

When it is mentioned that a first element “is connected or coupled to”, “contacts or overlaps” etc. a second element, it should be interpreted that, not only can the first element “be directly connected or coupled to”, or “directly contact or overlap” the second element, but a third element can also be “interposed” between the first and second elements, or the first and second elements can “be connected or coupled to”, “contact or overlap”, etc. each other via a fourth element. Here, the second element can be included in at least one of two or more elements that “are connected or coupled to”, “contact or overlap”, etc. each other.

When time relative terms, such as “after”, “subsequent to”, “next”, “before”, and the like, are used to describe processes or operations of elements or configurations, or flows or steps in operating, processing, manufacturing methods, these terms can be used to describe non-consecutive or non-sequential processes or operations unless the term “directly”, or “immediately” is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term “may” fully encompasses all the meanings of the term “can”.

Hereinafter, various embodiments of the present disclosure will be described in detail with reference to the accompanying drawings. All the components of each display device according to all embodiments of the present disclosure are operatively coupled and configured.

FIG. 1 is a diagram illustrating a system configuration of a display device (for example, an organic light-emitting display device, but is not limited thereto) 100 according to embodiments of the present disclosure.

Referring to FIG. 1, the display device 100 according to embodiments of the present disclosure can include a display panel PNL and a driving circuit for driving the display panel PNL. In the display panel PNL, a plurality of data lines DL and a plurality of gate lines GL can be arranged. In an active area AA of the display panel PNL, a plurality of subpixels SP connected to the plurality of data lines DL and the plurality of gate lines GL can be arranged. The plurality of subpixels SP can be arranged in a matrix configuration or other suitable configuration.

In terms of function, the driving circuit can include a data driver circuit DDC to drive the plurality of data lines DL, a gate driver circuit GDC to drive the plurality of gate lines GL, and a controller CTR to control the data driver circuit DDC and the gate driver circuit GDC.

In the display panel PNL, the plurality of data lines DL and the plurality of gate lines GL can be arranged to intersect each other. For example, the plurality of data lines DL can be arranged in rows or columns, and the plurality of gate lines GL can be arranged in columns or rows. For the convenience of explanation, it will be assumed below that the plurality of data lines DL are arranged in rows and the plurality of gate lines GL are arranged in columns.

The controller CTR controls the data driver circuit DDC and the gate driver circuit GDC by supplying thereto various control signals DCS and GCS necessary for the driving operation of the data driver circuit DDC and the gate driver circuit GDC.

The controller CTR starts scanning at appropriate points in time (in other words, at appropriate timing) realized in respective frames, converts the externally input image data into image data having a data signal format used readable by the data driver circuit DDC, outputs the converted image data DATA, and controls data driving at the appropriate points in time in response to the scanning.

Such a controller CTR can be a timing controller used in a typical display technology or a control device that can include the timing controller and further perform other control functions.

The controller CTR can be implemented as a separate component from the data driver circuit DDC, or can be combined with the data driver circuit DDC into an integrated circuit.

The data driver circuit DDC receives image data DATA from the controller CTR and supplies a data voltage to the plurality of data lines DL to drive the plurality of data lines DL. Here, the data driver circuit DDC can also be referred to as a source driver circuit.

The data driver circuit DDC can be implemented by including at least one source-driver integrated circuit (S-DIC). Each source-driver integrated circuit (S-DIC) can include a shift register, a latch circuit, a digital-to-analog converter (DAC), an output buffer, and the like. Each source-driver integrated circuit (S-DIC), in some cases, can further include an analog-to-digital converter (ADC).

Each source-driver integrated circuit (S-DIC) can be connected to a bonding pad on the display panel PNL in a tape-automated bonding (TAB) method or a chip-on-glass (COG) method, can be disposed directly on the display panel PNL, or in some cases, can be provided as an integrated portion of the display panel PNL. In addition, each source-driver integrated circuit (S-DIC) can be mounted on a source-circuit film connected to the display panel PNL in a chip-on-film (COF) manner.

A gate driver circuit GDC sequentially drives the plurality of gate lines GL by sequentially supplying scan signals to the plurality of gate lines GL. Here, the gate driver circuit GDC can also be referred to as a scan driver circuit.

The gate driver circuit GDC can be connected to the bonding pad of the display panel PNL in a TAB method or a COG method, can be implemented using a gate-in-panel (GIP) structure directly mounted on the display panel PNL, or in some cases, can be provided as an integrated portion of the display panel PNL. The gate driver circuit GDC can also be implemented as a plurality of gate driver integrated circuits (G-DICs) having a COF structure mounted on a gate-circuit film connected to the display panel PNL.

The gate driver circuit GDC sequentially supplies scan signals having an ON voltage or an OFF voltage to the plurality of gate lines GL under the control of the controller CTR.

The data driver circuit DDC converts the image data DATA received from the controller CTR into an analog data voltage and supplies the analog data voltage to the plurality of data lines DL when a specific gate line is opened (in other words, switched on) by the gate driver circuit GDC.

The data driver circuit DDC can be located on only one side of (e.g., above or below) the display panel PNL, or in some cases, on both sides of (e.g., above and below) the display panel PNL, depending on the driving method, the design of the display panel, or the like.

The gate driver circuit GDC can be located on only one side (e.g., to the left or right) of the display panel PNL, or in some cases, on both sides (e.g. to the left and right) of the display panel PNL, depending on the driving method, the design of the display panel, or the like.

The plurality of gate lines GL disposed on the display panel PNL can include a plurality of scan lines SCL, a plurality of sensing lines SENL, and a plurality of emission control lines EML. The scan lines SCL, sensing lines SENL, and emission control lines EML are conductive lines that transfer different types of gate signals (e.g., scan signals, sense signals, and emission control signals) to gate nodes of different types of transistors (e.g., scan transistors, sense transistors, and emission control transistors).

Figure 2:
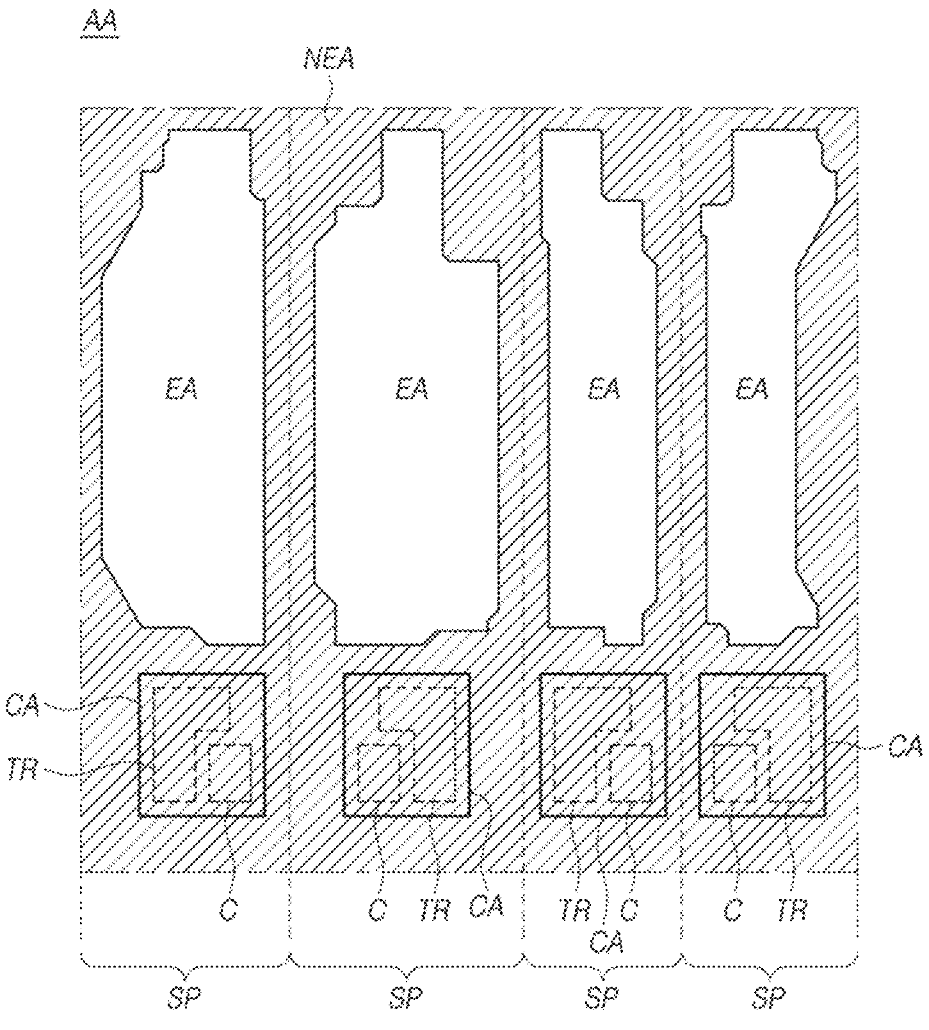
FIGS. 2 to 4 are plan diagrams illustrating selected areas of the display device according to embodiments of the present disclosure.

FIG. 2 is a plan diagram illustrating a display device according to embodiments. More specifically, FIG. 2 is a plan diagram illustrating a portion of the active area of the display device according to embodiments of the present disclosure.

Referring to FIG. 2, the display device according to embodiments of the present disclosure can include emitting areas EA located in the active area AA, and a non-emitting area NEA located in the active area AA. A plurality of subpixels SP are located in the active area AA. The plurality of subpixels SP can respectively include an emitting area EA and a circuit area CA.

The plurality of subpixels SP are located in the active area AA. Each of the emitting areas EA can be an area in which light generated by a light-emitting device of the subpixel SP is emitted. For example, the emitting area EA can be an area defined by an open area in a bank and can correspond to a light-emitting device revealed by the open area in the bank.

The non-emitting area NEA can be, for example, the remaining area of the active area AA except for the emitting areas EA. The non-emitting area NEA can include various circuit elements (transistors, capacitors, etc.) for driving the light-emitting devices, and various signal lines (data lines, gate lines, etc.) for applying signals to the circuit elements and the light-emitting devices.

The non-emitting area NEA can include, for example, circuit areas CA in which various circuit elements are located. Each of the circuit areas CA can be an area in which various circuit elements of the corresponding subpixel are located. For example, a transistor TR and a capacitor C can be located in the circuit area CA. The transistor TR can be at least one of, for example, a driving transistor and a scan transistor. The capacitor C can be a storage capacitor. Each of the subpixels SP can include a plurality of transistors or a plurality of capacitors. For example, each subpixel SP can include two transistors and one capacitor.

A metal layer can be located in the non-emitting area NEA. The metal layer can be a layer in which various circuit elements and various signal lines located in the non-emitting area NEA are formed. For example, the metal layer can include source and drain electrodes, a gate electrode, a capacitor, and a pad portion of a transistor. The metal layer can have a multilayer structure formed of a metallic material. The metal layer can contain, for example, copper (Cu), molybdenum (Mo), tungsten (W), and titanium (Ti).

An active layer can be located in the non-emitting area NEA. The active layer can be a layer in which transistors located in the non-emitting area NEA are formed. The active layer can be comprised of at least one of, for example, InZnO (IZO), InGaO (IGO), InSnO (ITO), InGaZnO (IGZO), InGaZnSnO (IGZTO), InSnZnO (ITZO), InGaSnO (IGTO), GaO (GO), GaZnSnO (GZTO), and GaZnO (GZO) based oxide semiconductor materials.

A light shield (or light shielding layer) can be located in the non-emitting area NEA of the active area AA. The light shield can be a layer for preventing external light from reaching light-sensitive circuit elements. The light shield can be located such that at least a portion thereof overlaps the active layer. Alternatively, the light shield can be located such that at least a portion thereof overlaps the entire area of the active layer. When the light shield is located to overlap the active layer, degradations in characteristics of the active layer due to UV (ultraviolet) radiation can be prevented.

In the non-emitting area NEA, a low reflective layer can be located. The low reflective layer can be a layer allowing the display device to have a low reflectivity with respect to external light. For example, the low reflective layer can include one of copper (Cu), molybdenum (Mo), titanium (Ti), aluminum (Al), and an oxide. The oxide can be, for example, InZnO (IZO), InGaO (IGO), InSnO (ITO), InGaZnO (IGZO), InGaZnSnO (IGZTO), InSnZnO (ITZO), InGaSnO (IGTO), GaO (GO), GaZnSnO (GZTO), and GaZnO (GZO) based materials. The low reflective layer can have a single-layer or multilayer structure.

The low reflective layer can be located such that at least a portion thereof overlaps the light shield. Alternatively, the low reflective layer can be located such that at least a portion thereof overlaps the entire area of the light shield. When the low reflective layer is located to overlap the light shield, the display device can have a lower reflectivity with respect to external light.

Figure 3:
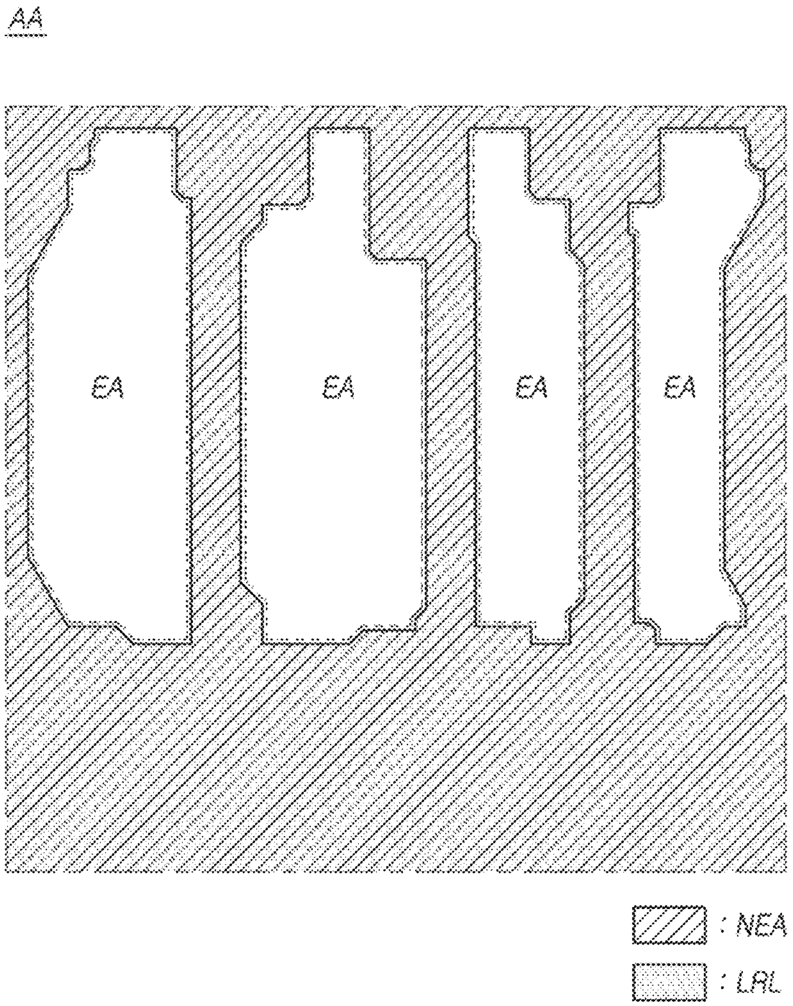

FIG. 3 is a plan diagram illustrating some areas of the display device according to embodiments of the present disclosure. More specifically, FIG. 3 illustrates a portion of the active area AA of the display device according to embodiments of the present disclosure in which a low reflective layer LRL is located.

According to embodiments illustrated in FIG. 3, the active area AA can include emitting areas EA and a non-emitting area NEA. The low reflective layer LRL can be located so as not to overlap the emitting areas EA. The low reflective layer LRL can be located in the non-emitting area NEA. For example, the low reflective layer can be located substantially in the entirety of the non-emitting area NEA. When the low reflective layer LRL is located substantially in the entirety of the non-emitting area NEA, external light can be prevented from being reflected from various signal lines and circuit elements located in the non-emitting area NEA and viewed by the user.

Figure 4:
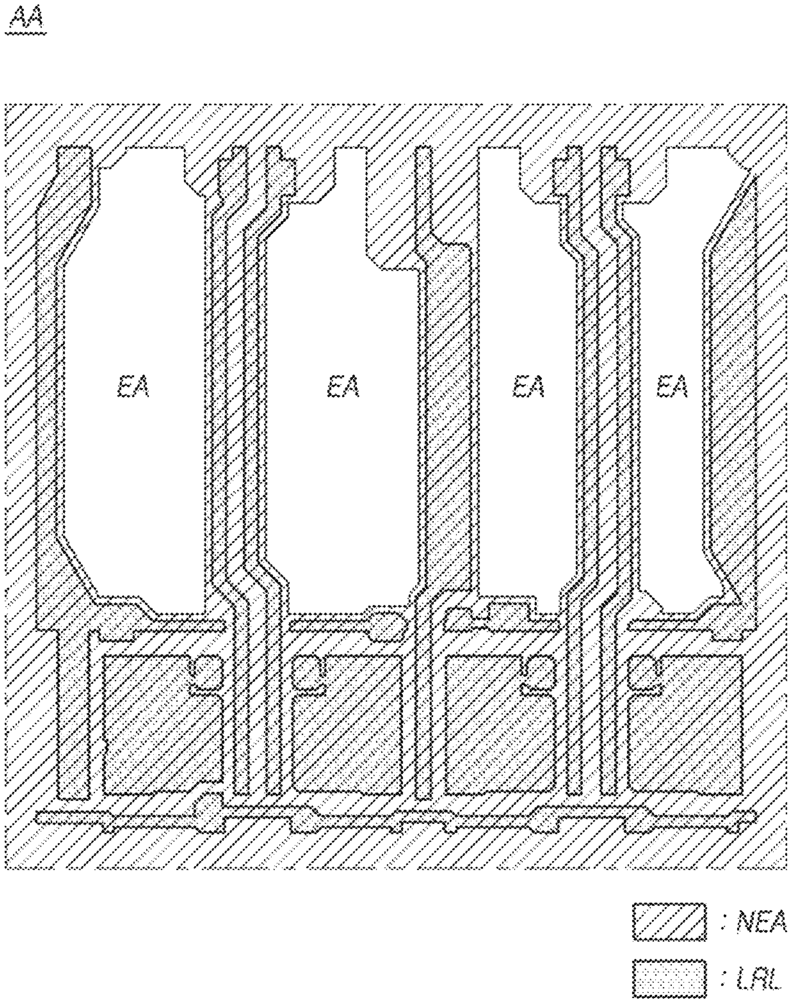

FIG. 4 is a plan diagram illustrating some areas of the display device according to embodiments of the present disclosure. More specifically, FIG. 4 illustrates a portion of the active area AA of the display device according to embodiments in which a low reflective layer LRL is located.

Referring to FIG. 4, the low reflective layer LRL can be located so as not to overlap the emitting areas EA. The low reflective layer LRL can be located in a non-emitting area NEA. For example, the low reflective layer LRL can be located in the non-emitting area NEA and can include a plurality of island-shaped portions (in other words, a plurality of portions in the form of islands). When the low reflective layer LRL is comprised of the plurality of island-shaped portions, respective portions can be electrically connected through contact holes with another layer located above or below the low reflective layer LRL to eliminate parasitic capacitance generated by the low reflective layer LRL and the layer above or below the low reflective layer LRL. Thus, the display device can have a low reflectivity while preventing the display quality from being degraded by parasitic capacitance.

Figure 5:
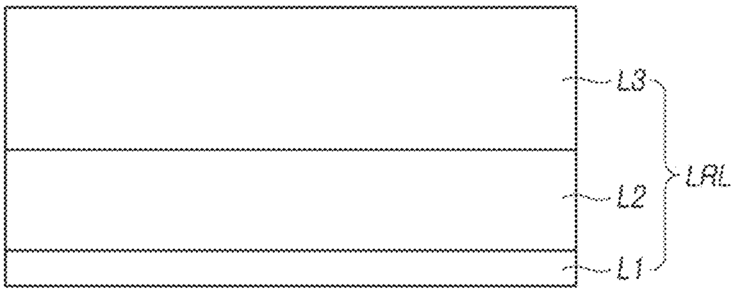
FIG. 5 is a cross-sectional diagram illustrating a low reflective layer according to embodiments of the present disclosure.

FIG. 5 is a cross-sectional diagram illustrating a low reflective layer LRL according to embodiments of the present disclosure.

Referring to FIG. 5, the low reflective layer LRL can include a plurality of layers. When the low reflective layer LRL is multi-layered, the low reflective layer LRL can include, for example, a first layer L1, a second layer L2, and a third layer L3.

For example, the first layer L1 and the third layer L3 can be formed of the same material or substantially the same material, and the second layer L2 can be formed of a material different from that of the first layer L1 and the third layer L3.

For example, the first layer L1 and the third layer L3 can each include at least one of copper (Cu), molybdenum (Mo), and titanium (Ti). The low reflective layer LRL can be, for example, formed of moly titanium (MoTi). The second layer L2 can include at least one of InZnO (IZO), InGaO (IGO), InSnO (ITO), InGaZnO (IGZO), InGaZnSnO (IGZTO), InSnZnO (ITZO), InGaSnO (IGTO), GaO (GO), GaZnSnO (GZTO), and GaZnO (GZO) based materials. The second layer L2 can be, for example, formed of an IZO material. When the low reflective layer LRL described above is used, the low reflective layer LRL having a lower reflectivity can be formed by a simple process.

Figure 6:
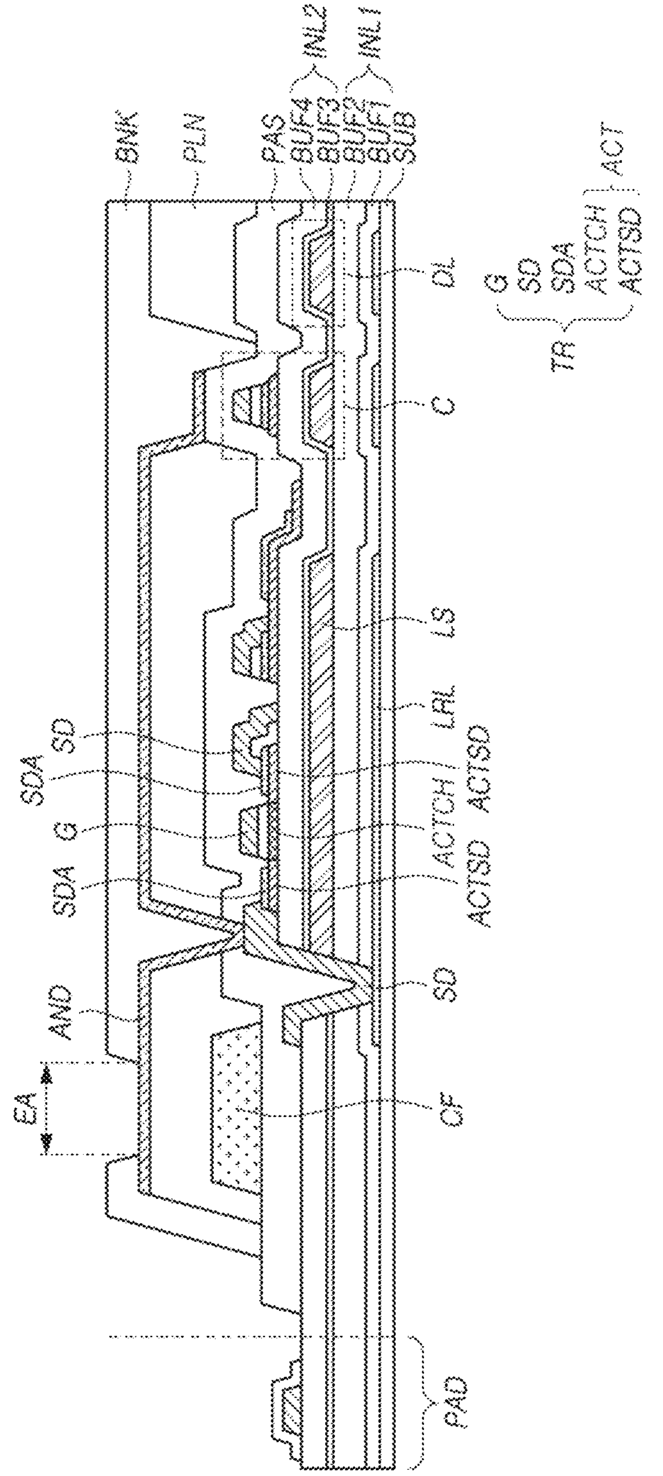
FIG. 6 is a cross-sectional diagram illustrating a display device according to embodiments of the present disclosure.

FIG. 6 is a cross-sectional diagram illustrating a display device according to embodiments of the present disclosure. More specifically, FIG. 6 is a cross-sectional diagram illustrating a portion of the active area AA and a portion of an area outside the active area AA of the display device according to embodiments of the present disclosure.

Referring to FIG. 6, the display device according to embodiments of the present disclosure can include a substrate SUB, a low reflective layer LRL located on the substrate SUB, a first insulating layer (or first insulating film) INL1 located on the low reflective layer LRL, a light shield LS (or light shielding layer) located on the first insulating layer INL1, a second insulating layer (or second insulating film) INL2 located on the light shield LS, and a transistor TR located on the second insulating layer INL2.

The substrate SUB is for example, a plastic or glass substrate on which the transistors are formed. The substrate SUB can have a single-layer or multilayer structure.

The low reflective layer LRL can be located on the substrate SUB. In addition, various circuit elements and signal lines can be located on the substrate SUB. The low reflective layer LRL can be located such that at least a portion thereof overlaps an active layer ACT, various circuit elements, and signal lines located over the low reflective layer. For example, the low reflective layer LRL can be located so as to overlap a capacitor C and a data line DL. The display device can have a low reflectivity by locating the low reflective layer LRL to overlap the active layer ACT, the capacitor C, and the data line DL.

The first insulating layer INL1 can be an insulating layer located between the low reflective layer LRL and the light shield LS and having a single-layer or multilayer structure. The first insulating layer INL1 can include, for example, a first buffer layer BUF1 and a second buffer layer BUF2. Each of the first buffer layer BUF1 and the second buffer layer BUF2 can be an organic or inorganic layer.

The light shield LS can be located such that at least a portion thereof overlaps the low reflective layer LRL. The light shield LS can be located, for example, such that substantially the entirety thereof overlaps the low reflective layer LRL When the light shield LS is located so as to overlap the low reflective layer LRL, external light can be prevented from being reflected by the light shield LS, and thus the display device can have a low reflectivity.

Circuit elements and signal lines can be disposed on the first insulating layer INL1. For example, a plate of the capacitor C and the data line DL can be disposed on the first insulating layer INL1. The plate of the capacitor C and the data line DL can be formed of substantially the same material as the light shield LS.

The second insulating layer INL2 can be an insulating layer located between the light shield LS and the transistor TR and having a single-layer or multilayer structure. The second insulating layer INL2 can include, for example, a third buffer layer BUF3 and a fourth buffer layer BUF4. Each of the third buffer layer BUF3 and the fourth buffer layer BUF4 can be an organic or inorganic layer.

A metal layer can be located on the second insulating layer INL2. The metal layer can refer to a patterned conductive layer located on the second insulating layer INL2. The metal layer can be a conductive layer in which various circuit elements and signal lines of the display device are formed. The metal layer can be denoted by different terms depending on the function thereof. For example, the metal layer can be a plate of a source-drain electrode SD, a gate electrode G, and a capacitor C.

The low reflective layer LRL can be located such that at least a portion thereof overlaps the metal layer. For example, the low reflective layer LRL can be located such that at least a portion thereof overlaps the source-drain electrode SD, the low reflective layer LRL can be located such that at least a portion thereof overlaps the gate electrode G, and the low reflective layer LRL can be located such that at least a portion thereof overlaps the plate of the capacitor C. By locating at least a portion of the low reflective layer LRL to overlap the metal layer, external light can be prevented from being reflected by the metal layer, and thus the display device can have a low reflectivity.

The transistor TR can include a source-drain electrode SD, a gate electrode G, and an active layer ACT. The active layer ACT can include a source-drain region ACTSD and a channel region ACTCH. The source-drain region ACTSD can be a conductive region of the active layer ACT. The channel region ACTCH can be a region located between the conductive source-drain regions ACTSD.

The transistor TR can be located such that at least a portion thereof overlaps the light shield LS. For example, the active layer ACT of the transistor TR can be located so as to overlap the light shield LS. Alternatively, the channel region ACTCH of the transistor TR can be located so as to overlap the light shield LS. When the light shield LS is located so as to overlap the transistor TR, degradations in device characteristics of the transistor TR due to external UV radiation can be prevented.

The transistor TR can include a secondary electrode SDA. The secondary electrode SDA can be an electrode in contact with the source-drain electrode SD and the source-drain region ACTSD of the active layer ACT.

The source-drain electrode SD and the gate electrode G can be provided as the same material layer. For example, the source-drain electrode SD and the gate electrode G can be provided as a multilayer. The source-drain electrode SD and the gate electrode G can be provided as, for example, a bilayer. In the source-drain electrode SD and the gate electrode G, for example, a lower layer adjacent to the substrate SUB can contain molybdenum (MoTi), and an upper layer can contain copper (Cu).

Circuit elements and signal lines can be disposed on the second insulating layer INL2. For example, a plate of the capacitor C and the transistor TR can be disposed on the second insulating layer INL2. The plate of the capacitor C located on the second insulating layer INL2 can have a single layer or multilayer structure, for example, can include one or more of the same material layers as the active layer ACT, the secondary electrode SDA, and the gate electrode G.

Figure 8:
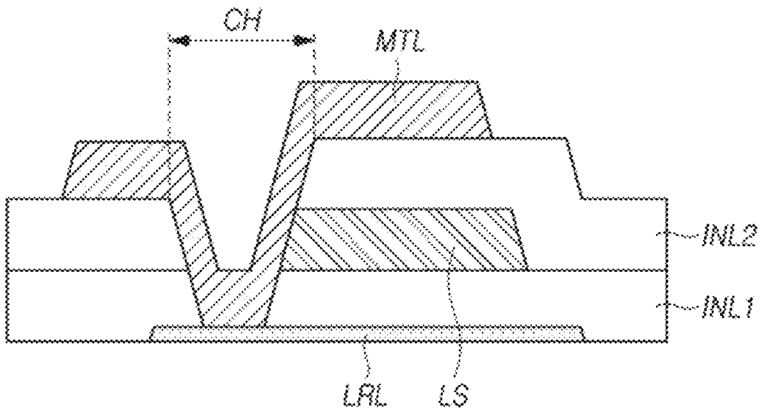
FIGS. 8 and 9 are cross-sectional diagrams illustrating display devices according to embodiments of the present disclosure.

The source-drain electrode SD of the transistor TR, the light shield LS, and the low reflective layer LRL can be electrically connected in a single contact hole CH (see, for example, FIG. 8). When the source-drain electrode SD, the light shield LS, and the low reflective layer LRL are electrically connected in the contact hole CH, parasitic capacitance may not be generated by the source-drain electrode SD, the light shield LS, and the low reflective layer LRL, thereby it can prevent parasitic capacitance from degrading the display quality of the display device. Since the low reflective layer LRL can be electrically connected to another layer located so as to overlap the low reflective layer LRL through the contact hole CH, it is possible to realize a low reflectivity due to the low reflective layer LRL and prevent the low reflective layer LRL from generating parasitic capacitance with other layers.

The contact hole CH can extend through the first insulating layer INL1 and the second insulating layer INL2. Due to the contact hole CH extending through the first insulating layer INL1, the low reflective layer LRL and the light shield LS can be electrically connected in the contact hole CH. Due to the contact hole CH extending through the second insulating layer INL2, the light shield LS and the source-drain electrode SD can be electrically connected in the contact hole CH.

The contact hole CH can extend through both the first insulating layer INL1 and the second insulating layer INL2 Due to the contact hole CH extending through both the first insulating layer INL1 and the second insulating layer INL2, the low reflective layer LRL, the light shield LS, and the source-drain electrode SD can be electrically connected at the contact hole CH.

At least a portion of the source-drain electrode SD can be located inside the contact hole CH. By locating at least a portion of the source-drain electrode SD inside the contact hole CH, parasitic capacitance may not be generated between the low reflective layer LRL and the source-drain electrode SD, thereby degradations in the display quality of the display device can be prevented.

The light shield LS can be in contact with the source-drain electrode SD at the side of the contact hole CH. The source-drain electrode SD can be in contact with the low reflective layer LRL at the center of the contact hole CH. Since the light shield LS is in contact with the source-drain electrode SD at the side of the contact hole CH and the source-drain electrode SD is in contact with the low reflective layer LRL at the center of the contact hole CH, the low reflective layer LRL, the light shield LS, and the source-drain electrode SD can be electrically connected to each other in the contact hole CH, thereby it can prevent parasitic capacitance from being generated between the low reflective layer LRL, the light shield LS, and the source-drain electrode SD.

A passivation layer PAS and a planarization layer PLN can be located on the transistor TR. A light-emitting device can be located on the planarization layer PLN. The light-emitting device can include a first electrode AND. For example, the light-emitting device can include a first electrode AND, a second electrode, and a light-emitting layer located between the first electrode AND the second electrode. The first electrode AND can be located on the planarization layer PLN The display device can have a bottom emission structure. When the display device has the bottom emission structure, the first electrode AND can be a transparent electrode.

A bank BNK can be located on the first electrode AND. An open area in the bank BNK can define an emitting area EA. For example, the emitting area EA can be an area corresponding to the first electrode AND revealed by the open area of the bank BNK.

At a location corresponding to the emitting area EA, a color filter CF can be located. The color filter CF can be located on the passivation layer PAS. By locating the color filter CF at a location corresponding to the emitting area EA, the wavelength of light emitted by the light-emitting device can be converted into a different wavelength.

The display device 100 can include a pad portion PAD on the periphery thereof. A pad electrode can be located on the pad portion.

Figure 7:
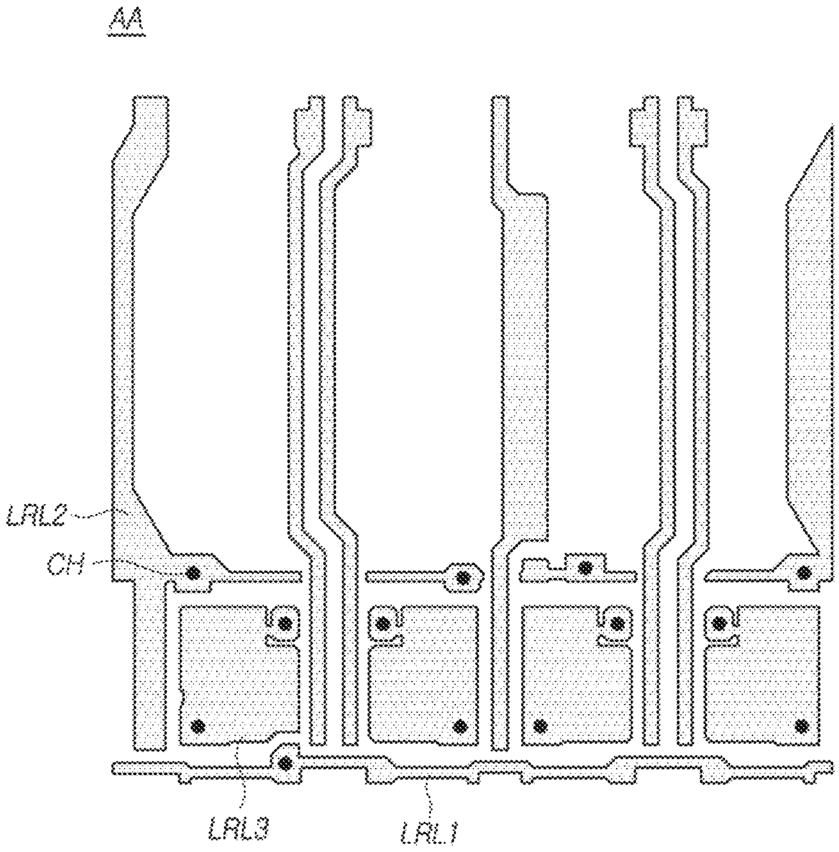
FIG. 7 is a plan diagram illustrating the display device according to embodiments of the present disclosure.

FIG. 7 is a plan diagram illustrating a display device according to embodiments of the present disclosure. More specifically, FIG. 7 illustrates an area in which a reflective layer LRL is located and the locations of contact holes in an active area AA of the display device according to embodiments of the present disclosure.

Referring to FIG. 7, a low reflective layer LRL can include a plurality of island-shaped portions. The low reflective layer LRL can include a first portion LRL1 island-shaped and electrically connected to a metal layer through a contact hole CH. For example, when the metal layer is located so as not to overlap the light shield, the low reflective layer LRL can be located to overlap the metal layer rather than the light shield. When the low reflective layer LRL is located to overlap the metal layer, rather than overlapping the light shield as in this case, it is possible to prevent light generated externally of the display device from being reflected by the metal layer. The low reflective layer LRL can include a second portion LRL2 island-shaped and electrically connected to the light shield through a contact hole CH. The low reflective layer LRL can include a third portion LRL3 island-shaped and electrically connected to the light shield and the metal layer through a contact hole.

By providing the plurality of island-shaped portions of the low reflective layer LRL so as to be electrically connected through contact holes with an overlying or underlying metal layer or light shield, parasitic capacitance can be prevented from occurring (or can be minimized) between the low reflective layer LRL and the metal layer and between the low reflective layer LRL and the light shield, thereby it can prevent parasitic capacitance from degrading the display quality of the display device.

To prevent the low reflective layer LRL from forming parasitic capacitance with other layers, each of the first, second and third island-shaped portions LRL1, LRL2, and LRL3 of the low reflective layer LRL can include at least one contact hole. Since each portion of the low reflective layer LRL includes a contact hole to be in contact with the metal layer and/or the light shield, parasitic capacitance can be prevented from being generated by the low reflective layer LRL.

While FIG. 7 illustrates the first portion LRL1, the second portion LRL2, and the third portion LRL3 for illustrative purposes, whether each portion of the low reflective layer LRL is one of the first to third portions is determined by the layer to which each portion is electrically connected, and embodiments of the present disclosure are not limited to those illustrated in FIG. 7.

FIG. 8 is a cross-sectional diagram illustrating a display device according to embodiments of the present disclosure. More specifically, FIG. 8 is a cross-sectional diagram illustrating a portion of the display device according to embodiments of the present disclosure, showing that a low reflective layer LRL is electrically connected to a light shield LS and a metal layer MTL by a contact hole.

Referring to FIG. 8, the low reflective layer LRL can be electrically connected to the light shield LS and the metal layer MTL through the contact hole CH. All of the metal layer MTL, the light shield LS, and the low reflective layer LRL can be connected through the contact hole CH.

The contact hole CH can extend through the first insulating layer INL1 and the second insulating layer INL2. Due to the contact hole CH extending through the first insulating layer INL1 located between the low reflective layer LRL and the light shield LS and the second insulating layer INL2 located between the metal layer MTL and the light shield LS, the metal layer MTL, the light shield LS, and the low reflective layer LRL can be electrically connected to each other through the contact hole CH.

When the metal layer MTL, the light shield LS, and the low reflective layer LRL are connected to each other through the contact bole CH, parasitic capacitance is not generated between the metal layer MTL, the light shield LS, and the low reflective layer LRL, which are at least partially overlapped. Thus, the display quality of the display device can be prevented from being degraded due to the parasitic capacitance.

The contact hole CH illustrated in FIG. 8 can be a contact hole located, for example, in the second portion LRL2 and third portion LRL3 of the low reflective layer. In this example, the second portion LRL2 can be located to overlap a subpixel driving voltage (EVDD) line, and the third portion LRL3 can be located to overlap a subpixel driving transistor.

Figure 9:
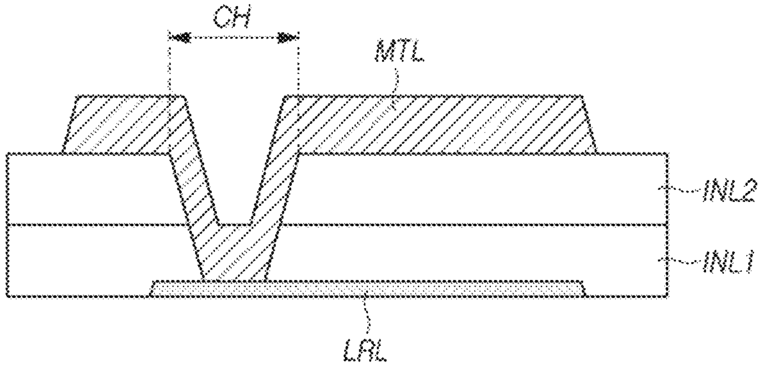

FIG. 9 is a cross-sectional diagram illustrating a display device according to embodiments of the present disclosure. More specifically, FIG. 9 is a cross-sectional diagram illustrating a portion of the display device according to embodiments of the present disclosure, showing that a low reflective layer LRL is electrically connected to a metal layer MTL through a contact hole CH.

Referring to FIG. 9, the low reflective layer LRL can be electrically connected to the metal layer MTL through the contact hole CH. The contact hole CH can extend through the first insulating layer INL1 and the second insulating layer INL2. Due to the contact hole CH extending through the first insulating layer INL1 and the second insulating layer INL2 located between the metal layer MTL and the low reflective layer LRL, the metal layer MTL and the low reflective layer LRL can be electrically connected through the contact hole CH.

When the metal layer MTL and the low reflective layer LRL are electrically connected through the contact hole CH, parasitic capacitance is not generated between the metal layer MTL and the low reflective layer LRL, which are at least partially overlapped. Thus, it is possible to prevent the display quality of the display device from being degraded due to the parasitic capacitance.

The contact hole CH illustrated in FIG. 9 can be, for example, a contact hole located in the first portion LRL1 of the low reflective layer. In this example, the first portion LRL1 can be located to overlap a gate line (e.g., a scan line, a sensing line, or a light control line). The light shield does not overlap the gate line and the first portion LRL1, since parasitic capacitance can be generated by the overlap of the gate line and the light shield.

Figure 10:
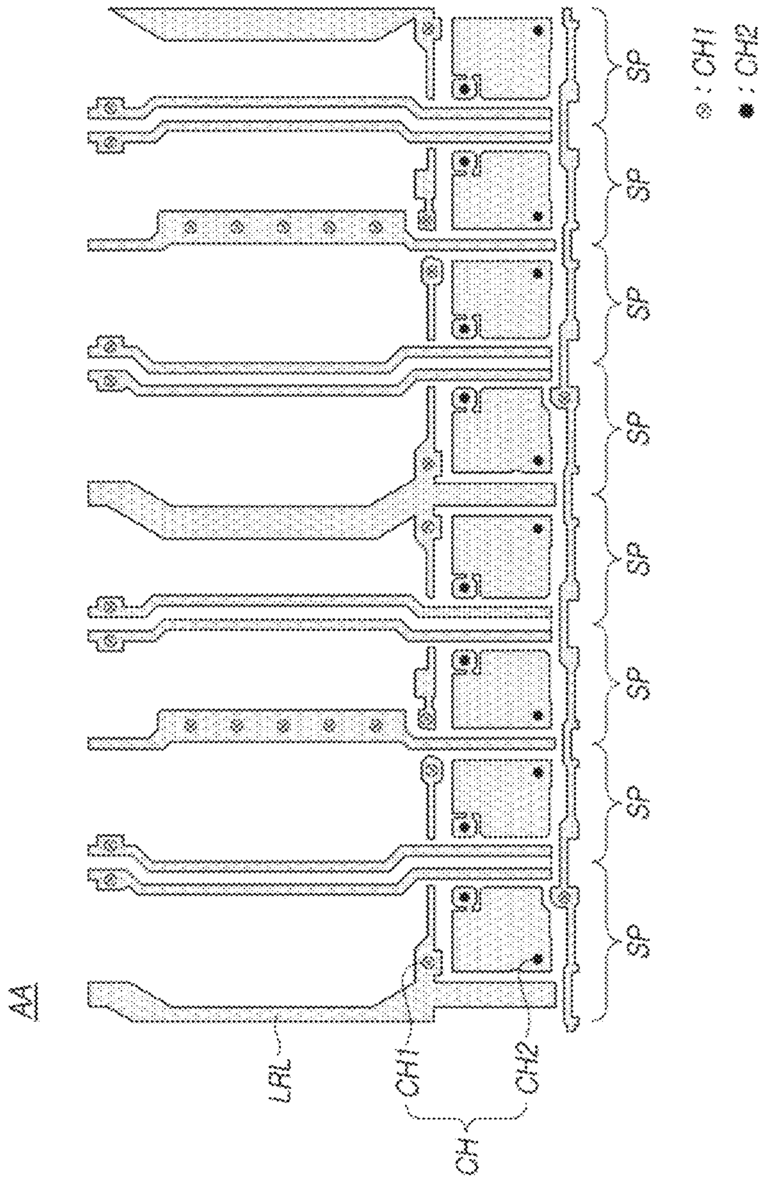
FIGS. 10 and 11 are plan diagrams illustrating display devices according to embodiments of the present disclosure.

FIG. 10 is a plan diagram illustrating a display device according to embodiments of the present disclosure. More specifically, FIG. 10 depicts a low reflective layer LRL and contact holes CH in the active area of the display device according to embodiments of the present disclosure.

Referring to FIG. 10, the contact holes CH electrically connecting the low reflective layer LRL to the metal layer and/or the light shield can be located in the active area AA. The display device according to the embodiments of the present disclosure can include first contact holes CH1 electrically connecting the low reflective layer LRL and signal lines located in the active area AA and second contact holes CH2 electrically connecting the low reflective layer LRL and circuit elements located in the active area AA.

The first contact holes CH1 can be located in the active area AA to electrically connect the various signal lines to the portions of the low reflective layer LRL located to overlap the various signal lines located in the active area AA. In addition, the second contact holes CH2 can be located in the active area AA to electrically connect respective portions of the low reflective layer LRL to circuit elements located in the active area AA.

When the plurality of first contact holes CH1 and the plurality of second contact holes CH2 are located in the active area AA, at least one first contact hole CH1 and at least one second contact hole CH2 can be located in each subpixel SP, thereby it can prevent mis-contact in which the low reflective layer LRL is not electrically connected to the signal line. In addition, parasitic capacitance can be effectively prevented from being generated by the mis-contact.

Figure 11:
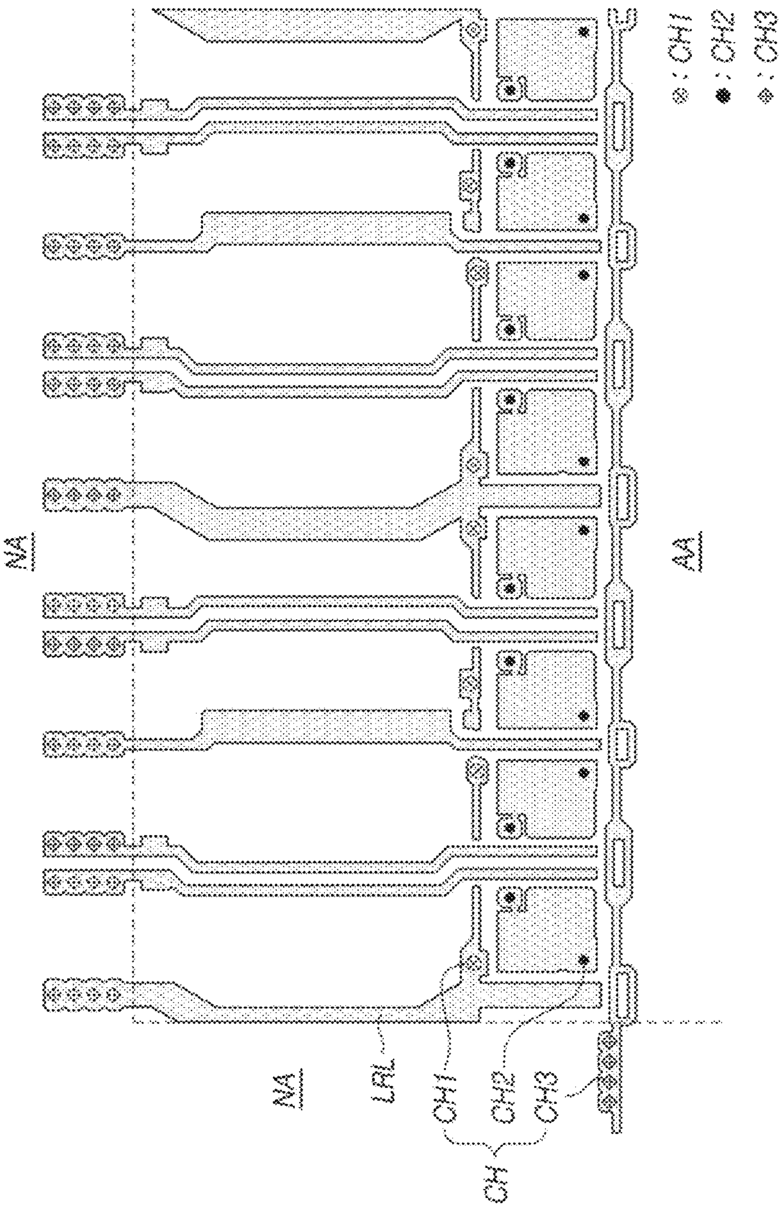

FIG. 11 is a plan diagram illustrating a display device according to embodiments of the present disclosure More specifically, FIG. 11 illustrates a low reflective layer LRL and contact holes CH in the active area AA and the non-active area NA of the display device according to embodiments of the present disclosure.

Referring to FIG. 11, the contact holes CH electrically connecting the low reflective layer LRL to the metal layer and/or the light shield can be located in the active area AA and the non-active area NA. The display device according to embodiments of the present disclosure can include first contact holes CH1 electrically connecting the low reflective layer LRL to a signal line located in the active area AA, second contact holes CH2 electrically connecting the low reflective layer LRL to circuit elements located in the active area AA, and third contact holes CH3 electrically connecting the low reflective layer LRL to signal lines located in the non-active area NA.

The first contact holes CH1 can be located in the active area AA to electrically connect various signal lines and portions of the low reflective layer LRL located to overlap various signal lines. The second contact holes CH2 can be located in the active area AA to electrically connect respective portions of the low reflective layer LRL to the circuit elements located in the active area AA. In addition, the third contact holes CH3 can be located in the non-active area NA to electrically connect portions of the low reflective layer LRL overlapping the various signal lines to the various signal lines.

When the plurality of third contact holes CH3 are located in the non-active area NA, the third contact holes CH3 are located in the non-active area NA in which no pixels are disposed, thereby it can prevent parasitic capacitance from occurring between the low reflective layer and the signal line and degrading the display quality of the display device. Furthermore, when the third contact holes CH3 are located in the non-active area NA, the reduction of the open area rate of the subpixel can be minimized, differently from the case in which the contact holes are located in the active area AA.

Although the plurality of first contact holes CH1, the plurality of second contact holes CH2 and the plurality of third contact hole CH3 are located in the active area AA and the non-active area NA in the embodiments illustrated in FIG. 11, embodiments of the present disclosure are not limited to the display device having the plurality of first contact holes CH1, the plurality of second contact holes CH2 and the plurality of third contact hole CH3. For example, an embodiment in which a low reflective layer LRL is provided and a minimum number of contact boles are provided to prevent parasitic capacitance from occurring in respective island-shaped portions of the low reflective layer can also be included in the scope of the present disclosure. In this example, each of the island-shaped portions of the low reflective layer LRL can include a single contact hole.

The embodiments of the present disclosure described above can be briefly described as follows.

In one aspect, the display device (e.g., 100) can include the emitting areas EA located in the active area AA, the non-emitting area NEA located in the active area AA, the metal layer MTL located in the non-emitting area NEA, the active layer ACT located in the non-emitting area NEA, the light shield LS located in the non-emitting area NEA, and the low reflective layer LRL located in the non-emitting area NEA.

The light shield LS can be located such that at least a portion thereof overlaps the active layer ACT.

The low reflective layer LRL can be located such that at least a portion thereof overlaps the light shield LS.

The low reflective layer LRL can include one of copper (Cu), molybdenum (Mo), titanium (Ti), aluminum (Al), and an oxide.

The oxide can be one of InZnO (IZO), InGaO (IGO), InSnO (ITO), InGaZnO (IGZO), InGaZnSnO (IGZTO), InSnZnO (ITZO), InGaSnO (IGTO), GaO (GO), GaZnSnO (GZTO), and GaZnO (GZO) based materials.

The low reflective layer LRL can be located in the entirety of the non-emitting area NEA.

The low reflective layer LRL can include a plurality of island-shaped portions electrically connected through contact holes CH with the metal layer MTL and/or the light shield LS.

The low reflective layer LRL can include a plurality of layers.

The plurality of layers of the low reflective layer LRL can include a first layer L1, a second layer L2, and a third layer L3, the first layer L1 and the third layer L3 can be formed of the same material, and the second layer L2 can be formed of a material different from that of the first layer L1 and the third layer L3.

The first layer L1 and the third layer L3 can each include at least one of copper (Cu), molybdenum (Mo), and titanium (Ti), and the second layer L2 can include at least one of InZnO (IZO), InGaO (IGO), InSnO (ITO), InGaZnO (IGZO), InGaZnSnO (IGZTO), InSnZnO (ITZO), InGaSnO (IGTO), GaO (GO), GaZnSnO (GZTO), and GaZnO (GZO) based materials.

The low reflective layer LRL can be located such that at least a portion thereof overlaps the metal layer MTL.

The low reflective layer LRL can be electrically connected to the metal layer MTL through the contact hole CH.

The low reflective layer LRL can include the island-shaped first portion LRL1. The first portion LRL1 can be electrically connected to the metal layer MTL through the contact hole CH.

The low reflective layer LRL can be electrically connected to the light shield LS through the contact hole CH.

The low reflective layer LRL can include the second portion LRL2 in the form of an island. The second portion LRL2 can be electrically connected to the light shield LS through the contact hole CH.

The display device (e.g., 100) can include the contact hole CH through which the metal layer MTL, the light shield LS, and the low reflective layer LRL are electrically connected to each other.

The low reflective layer LRL can include the third portion LRL3 in the form of an island. The third portion LRL3 can be electrically connected to the light shield LS and the metal layer MTL through the contact hole.

Each of the first portion LRL1, the second portion LRL2 and the third portion LRL3 of the low reflective layer LRL can include at least one contact hole CH.

The display device (e.g., 100) can include the first insulating layer INL1 located between the low reflective layer LRL and the light shield LS.

The display device (e.g., 100), can include the second insulating layer INL2 located between the light shield LS and the metal layer MTL.

The display device (e.g., 100) can include the contact hole CH located in the active area AA. The contact hole CH can electrically connect at least one of the metal layer MTL and the light shield LS to the low reflective layer LRL.

The display device (e.g., 100) can include first contact holes CH1 electrically connecting the low reflective layer LRL and signal lines located in the active area AA and second contact holes CH2 electrically connecting the low reflective layer LRL and circuit elements located in the active area AA.

The display device (e.g., 100) can include a plurality of subpixels SP, a plurality of first contact holes CH1 and a plurality of second contact holes CH2 can be located in the active area AA, at least one first contact hole CH1 and at least one second contact hole CH2 can be located in each subpixel SP.

The display device (e.g., 100) can include the contact hole CH located in the non-active area NA. The contact hole CH can electrically connect at least one of the metal layer and the light shield LS to the low reflective layer LRL.

The display device (e.g., 100) can include first contact holes CH1 electrically connecting the low reflective layer LRL to a signal line located in the active area AA, second contact holes CH2 electrically connecting the low reflective layer LRL to circuit elements located in the active area AA, and third contact holes CH3 electrically connecting the low reflective layer LRL to signal lines located in a non-active area NA.

The metal layer MTL can be at least one of a driving voltage line, a reference voltage line, a gate line, a data line, a gate electrode, and a source-drain electrode.

The display device (e.g., 100) can include the substrate SUB, the low reflective layer LRL disposed on the substrate SUB, the first insulating layer INL1 disposed on the low reflective layer LRL, the light shield LS disposed on the first insulating layer INL1, the second insulating layer INL2 disposed on the light shield LS, and the transistor TR disposed on the second insulating layer INL2.

The light shield LS can be located such that at least a portion thereof overlaps the low reflective layer LRL.

The transistor TR can be located such that at least a portion thereof overlaps the light shield LS.

The source-drain electrode SD of the transistor TR, the light shield LS, and the low reflective layer LRL can be electrically connected in a single contact hole (in other words, one contact hole) CH.

The contact hole CH can extend through the first insulating layer INL1 and the second insulating layer INL2. At least a portion of the source-drain electrode SD can be located inside the contact hole CH. The light shield LS can be in contact with the source-drain electrode SD on a side of the contact hole CH.

The source-drain electrode SD can be in contact with the low reflective layer LRL at the center of the contact hole CH.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present disclosure. The above description and the accompanying drawings provide an example of the technical idea of the present disclosure for illustrative purposes only. For example, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device comprising:

an active area;

a non-active area located outside the active area;

an emitting area located in the active area;

a non-emitting area located in the active area;

an active layer located in the non-emitting area;

a light shield located in the non-emitting area and extending into the non-active area;

a low reflective layer located in the non-emitting area so that at least a portion of the low reflective layer overlaps the light shield, the low reflective layer extending into the non-active area;

a first contact hole electrically connecting the low reflective layer to a signal line located in the active area;

a second contact hole electrically connecting the low reflective layer to a circuit element located in the active area;

a third contact hole electrically connecting the low reflective layer to a signal line located in the non-active area; and at least one buffer layer located between the light shield and the low reflective layer, wherein the light shield is in contact with the signal line located in the non-active area on a side wall of the third contact hole, wherein the at least one buffer layer is in contact with the signal line located in the non-active area on the side wall of the third contact hole, and wherein the low reflective layer is in contact with the signal line located in the non-active area at a center area of the third contact hole.

2. The display device according to claim 1, wherein the light shield is located in the non-emitting area so that at least a portion of the light shield overlaps the active layer.

3. The display device according to claim 1, wherein the low reflective layer includes one of copper, molybdenum, titanium, aluminum, and an oxide.

4. The display device according to claim 3, wherein the oxide is one of InZnO, InGaO, InSnO, InGaZnO, InGaZnSnO, InSnZnO, InGaSnO, GaO, GaZnSnO, and GaZnO based materials.

5. The display device according to claim 1, wherein the low reflective layer is located in the entire non-emitting area.

6. The display device according to claim 1, wherein the low reflective layer includes a plurality of island-shaped portions.

7. The display device according to claim 1, wherein the low reflective layer includes a plurality of layers.

8. The display device according to claim 7, wherein the plurality of layers in the low reflective layer include a first layer, a second layer, and a third layer, the first layer and the third layer are formed of a same material, and the second layer is formed of a material different from the material of the first layer and the third layer.

9. The display device according to claim 8, wherein the first layer and the third layer each includes at least one of copper, molybdenum, and titanium, and the second layer includes at least one of InZnO, InGaO, InSnO, InGaZnO, InGaZnSnO, InSnZnO, InGaSnO, GaO, GaZnSnO, and GaZnO based materials.

10. The display device according to claim 1, wherein the low reflective layer is located so that at least a portion of the low reflective layer overlaps the signal line located in the active area.

11. The display device according to claim 1, wherein the low reflective layer comprises a first portion having an island shape, and the first portion is electrically connected to the signal line located in the active area through the first contact hole.

12. The display device according to claim 11, wherein the low reflective layer further comprises a second portion having an island shape, and the second portion is electrically connected to the light shield through the second contact hole.

13. The display device according to claim 12, wherein the low reflective layer further comprises a third portion having an island shape, and the third portion is electrically connected to both the light shield and the signal line located in the non-active area through the third contact hole.

14. The display device according to claim 1, further comprising an insulating layer located between the light shield and the signal line located in the non-active area.

15. The display device according to claim 1, wherein at least the first contact hole and the second contact hole are located in each subpixel.

16. The display device according to claim 1, wherein the signal line located in the non-active area is at least one of a driving voltage line, a reference voltage line, a gate line, a data line, a gate electrode, and a source-drain electrode.

17. A display device comprising:

an active area;

a non-active area outside the active area;

a low reflective layer located on a substrate;

a first insulating layer located on the low reflective layer;

a light shield located on the first insulating layer so that at least a portion of the light shield overlaps the low reflective layer;

a second insulating layer located on the light shield;

a transistor located on the second insulating layer so that at least a portion of the transistor overlaps the light shield; and a first contact hole electrically connecting the low reflective layer to a signal line located in the active area;

a second contact hole electrically connecting the low reflective layer to a circuit element located in the active area; and a third contact hole electrically connecting the low reflective layer to a source-drain electrode located in the non-active area, wherein the light shield is in contact with the source-drain electrode located in the non-active area on a side wall of the third contact hole, wherein the first insulating layer is in contact with the source-drain electrode located in the non-active area on the side wall of the third contact hole, and wherein the low reflective layer is in contact with the source-drain electrode located in the non-active area at a center area of the third contact hole.

18. The display device according to claim 17, wherein the third contact hole extends through the first insulating layer and the second insulating layer, at least a portion of the source-drain electrode is located inside the third contact hole.

* * * * *